United States Patent
Ekbote et al.

(10) Patent No.: US 7,722,918 B2
(45) Date of Patent: May 25, 2010

(54) PROCESS FOR THE PREPARATION OF HIGH TEMPERATURE SUPERCONDUCTING BULK CURRENT LEADS WITH IMPROVED PROPERTIES AND SUPERCONDUCTING BULK CURRENT LEADS MADE THEREBY

(75) Inventors: Shrikant Narayan Ekbote, New Delhi (IN); Gursharan Kaur Padam, New Delhi (IN); Narinder Kumar Arora, New Delhi (IN); Mukul Sharma, New Delhi (IN); Ramesh Kumar Sethi, New Delhi (IN); Mrinal Kanti Banerjee, New Delhi (IN)

(73) Assignee: Council of Scientific & Industrial Research, New Delhi (IN)

( * ) Notice: Subject to any disclaimer, the term of this patent is extended or adjusted under 35 U.S.C. 154(b) by 339 days.

(21) Appl. No.: 11/506,967

(22) Filed: Aug. 17, 2006

(65) Prior Publication Data
US 2007/0213227 A1    Sep. 13, 2007

(30) Foreign Application Priority Data
Mar. 10, 2006   (IN)   .................  0640/DEL/2006

(51) Int. Cl.
*B05D 5/12*  (2006.01)
*C04B 35/45*  (2006.01)
(52) U.S. Cl. ........................ 427/62; 505/441
(58) Field of Classification Search ................... 427/62; 505/441

See application file for complete search history.

(56) References Cited

U.S. PATENT DOCUMENTS
6,359,540 B1 * 3/2002 Spiller et al. ................. 335/216
6,740,624 B1 * 5/2004 Hoste et al. .................. 505/480

FOREIGN PATENT DOCUMENTS
EP       0306974    *  3/1989
EP       1380541    *  1/2004

* cited by examiner

Primary Examiner—Brian K Talbot
(74) Attorney, Agent, or Firm—Abelman, Frayne & Schwab

(57) ABSTRACT

The present invention provides a process for the preparation of high temperature superconducting (HTS) bulk current leads capable of supplying a continuous current of more than 200 A at 77 K, at least for 2 to 4 hours without any substantial heat load to cryogen free cryocooler and other superconducting magnet systems. The superconducting bulk current leads with improved properties are prepared from an improved high temperature superconducting (HTS) bismuth based cuperate [$(Bi, Pb)_2Sr_2Ca_2Cu_3O_{10+x}$] material in tube and rod shape with both end metallic contacts. To produce such a lead, the process included modification of the superconducting material with homogeneous silver addition, a step of initial sintering in a large size tube followed by crushing into powder, a step of shaping the said initially sintered tube powder into tubes and rods of different size, a step of formation of metallic contacts by a perforated silver foil sandwiched between two metal spray deposited silver at both end parts of the said tubes and rods followed by a final step of co-sintering. In the current leads obtained according to these aspects, it is possible to stably carry current more than 200 A required for energizing superconducting magnet systems.

6 Claims, 3 Drawing Sheets

Figure 1A:
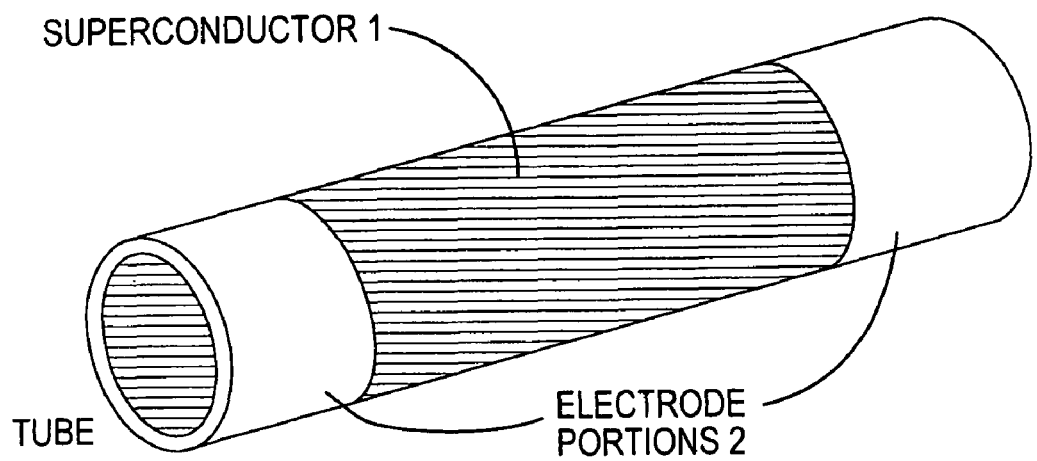

PROCESS FOR THE PREPARATION OF HIGH TEMPERATURE SUPERCONDUCTING BULK CURRENT LEADS WITH IMPROVED PROPERTIES AND SUPERCONDUCTING BULK CURRENT LEADS MADE THEREBY

The present invention relates to a process for the preparation of high temperature superconducting (HTS) bulk current leads with improved properties and superconducting bulk current leads made thereby. The present invention particularly relates to a process for the preparation of high temperature superconducting (HTS) bulk current leads with improved properties from an improved high temperature superconducting (HTS) bismuth based cuperate [$(Bi, Pb)_2 Sr_2Ca_2Cu_3O_{10+x}$] and superconducting bulk current leads made thereby. The present invention more particularly relates to the preparation of high temperature superconducting bulk $(Bi,Pb)_2Sr_2Ca_2Cu_3O_{10+x}$[(Bi,Pb)-2223] material and a method of preparation of tube and rod current leads of different sizes to be used when supplying a continuous current of more than 500 A at 77 K, at least for 2 to 4 hours, without any substantial heat load to cryogen free cryocooler and other superconducting magnet systems.

The use of HTS bulk or metal composite current leads in place of conventional current leads in most superconducting power devices offers an opportunity to reduce the heat load (due to resistive heating and thermal conduction) by $\frac{1}{10}^{th}$. The reduction in heat load is due to zero resistive loss and very low thermal conductivity of the HTS materials. Especially, devices like cryogen free cry-cooler and other superconducting magnet systems which require very low power loss or low thermal load in current transport, bulk tube/rod conductors in place of metal composite conductors are the first choice due to their much lower thermal conductivity.

The importance of high transport current and low contact resistivity is vital in these devices. Bulk tube/rod conductors having transport current not less than 200 A and contact resistance not more than micro Ohm range at 77 K are essential. Apart from importance of high transport current and low contact resistivity, importance of good fracture strength is also vital.

Current leads are required to transmit power between cryogenic equipment located within a cryostat and a power supply or load located at room temperature (RT). Conventional current leads use both the (i) traditional normal metal leads of good conductors such as Cu (in thin tube or wire form) as well as (ii) low-$T_c$ superconductors embedded in copper. Normal metal leads introduce heat leak to the cryostat as a result of heat conduction from the external conductor and the resistive heating in the lead itself. On the other hand, although low-$T_c$ superconductors embedded in copper were considered a better option, due to their zero resistance and high current transport capacity ($\sim 10^5$ A/cm$^2$), however, because of their low operating temperatures ($\sim 4.2$ K, i.e. requiring a constant flow of liquid He), these materials could not always replace Cu. The advent of high temperature superconductors (HTS) followed by continuous efforts in engineering, these materials by exploiting their high-$T_c$ and low thermal conductivity properties have made it possible for their first real large scale HTS production in the form of current leads. This has occurred because even modest current density in HTS material can be used to provide a significant reduction ($\sim \frac{1}{10}^{th}$) in the parasitic heat conducted into cryogenic environment with a short pay back time for the relatively low capital cost. To make such HTS current leads, there are two basic technologies: (i) metal matrix superconducting composite leads (generally Ag alloy/Ag sheathed superconducting material) and (ii) bulk tube and rod leads (a concept implemented by F. J. Mumford, Cryogenics, vol. 29, pp 206, 1989). Both have developed with careful and proper fabrication treatments to the point that they are offered for commercial scale, with consideration of their own advantages and disadvantages. For example, nearly an order of magnitude higher critical current density ($J_c$) obtained in metal matrix superconducting composite leads than for the bulk tube/rod current leads but the heat leak is at the same level as that of a Cu lead due to a high thermal conductivity of an Ag sheath. Whereas, on the other hand, bulk tube/rod current leads although have the disadvantage of having lower $J_c$ value but at the same time have the advantage of very low thermal conductivity as compared with the metallic Cu and Ag. However, both types of leads are used in cryogenic systems and in the field of magnetic shielding and fault current limiters.

All above utilization of HTS leads for high current (>1000 A) applications become ineffective if the contact resistance (Rc) of the joints of the normal metal conductors feeding high currents to these leads is of the order of $10^{-5}$ to $10^{-6}$ ohm. This contact resistance problem become more serious when HTS current leads are in the form of bulk tubes/rods. In order to utilize the bulk current leads to their optimum, Rc should be lower than $10^{-6}$ ohm for required currents of 200-1000 A at useful temperature range: 77 K -4 K. In a way, bulk current leads with low thermal load of the order of 0.1-0.01 W, zero resistance and $R_c \sim 10^{-7}$–$10^{-8}$ becomes the first economical, efficient and low loss choice for applications like close cycle superconducting magnet systems, feed through for high currents of kilo amperes, conduction-cooled magnets for MRI, most major accelerators that use superconducting magnets such as the CERN LHC, in HTS devices that operate at 20-30 K, e.g. the HTS transformer.

The problem of obtaining bulk HTS current leads and with achieving such $J_c$ and $R_c$ values has been tackled in parts in several ways such as using different: nominal compositions, methods to mix raw materials of the constituent elements to obtain starting mixed powder, steps of calcination/sintering, heating atmosphere and methods for making both end contacts.

Reference may be made to disclosure by P. F. Herrmann in Handbook of Applied Superconductivity vol I, section D. 10 Ed by B. Seeber, p. 801, 1998) where in, it is taught that among the two most useful and workable YBCO and BPSCCO (both low-$T_c$ Bi-2212 & high-$T_c$ Bi-2223) tube/rod conductors, the performance of the BPSCCO conductor in almost all aspects is superior to YBCCO conductor due to its lower thermal conductivity and easily achievable good $J_c$ in useful dimensions. In yet another disclosure by P. F. Herrmann in IEEE Transition Applied Superconductivity, vol 3, p. 876, 1993, it is learnt that in comparison to Bi-2212 bulk conductor, the performance of Bi-2223 is even better due to its higher $T_c$ and slightly lower thermal conductivity. The method disclosed in these references is preparation of calcined powder from solid-state route which starts with the oxides in the metallic ratio Bi:Pb:Sr:Ca:Cu=1.8:0.4:2:2,2:2, cold isopressing of calcined powder into tube/rod, and sintering.

There have been reports of lower $J_c$ values of 1 A-2.2 A/mm$^2$ at 77 K in zero-field for the Bi-2223 tube conductors. And attributing lower $J_c$ values to the poor quality of the end product.

There have been few more publications on Bi-2223 bulk tube/rod current leads by various groups. [D. U. Gubser et. al., IEEE, Trans. Magn., vol. 27, p. 1854 (1991); M. T. G. vander Laan, et. al., Adv. Cry. Eng., vol. 37, p. 1517 (1992); K. Watanabe et. al., Japn. J. Appl. Phys. Vol. 32, p. L488 (1993);

M. Takahashi et. al, Adv. Cryo. Eng. Vol. 39, p. 343 (1994), M. Satoh et. al, Advance in Cryogenic Engineering, Plenum Press, New York, Vol. 44, p. 405 (1998) using different methods: conventional solid state and chemical such as co-precipitation, sol-gel, heating nitrate solutions etc for the preparation of calcined powder, cold isopressing for tubes/rods, sintering in partial oxygen pressure and post sintering method for end contacts. However, the obtained Rc values were not sufficiently low and also the obtained $J_c$ values were not reasonably high. Moreover, the data was not very reproducible.

Y. Yamada in Bismuth Based High-Temperature Superconductors Ed by H. Maeda and T. Togano p 277 (1996) also used a conventional solid state route for the preparation of calcined powder from 99.9% pure starting oxides/carbonates etc, having (Bi, Pb): Sr:Ca:Cu in the ratio of 2:2:2:3, cold isopressing for tube/rod conductors but proposed a process in which cold isopressing step is added during sintering, making of end contacts from plasma sprayed single silver layer before final sintering, and use of partial oxygen pressure of sintering atmosphere, and it is taught that the $J_c$ can be increased according to this process. They reported the $J_c$ exceeding 1000 A/cm$^2$ and contact resistance as low as 0.02-0.1? ohm at 77 K in zero field have been achieved.

Reference may be made to U.S. Pat. No. 6,216,333, wherein is disclosed the method involving cold isopressing of synthetic Bi-2223 calcined powder into pellet/pipe/rod, adding two intermediate cold isopressings rather than one as in the above method during sintering, for end contacts; one layer formed either by winding a silver foil or by sputtering/evaporating silver or by applying silver paste followed by post sintering and use of air as sintering atmosphere and it is taught that $J_c$ can be further increased and $R_c$ can be decreased according to this process. Then reporting higher $J_c$ values i.e. not less than 2000 A/cm$^2$ and contact resistivity of not more than 0.05? ohm cm$^2$ at 77 K in zero magnetic field.

All the above solid state and chemical: such as co-precipitation, and sol-gel and heating nitrate solution methods have similar limitations of producing a precursor powder in large quantity with desired homogeneity, thereby leading to non-homogeneous end product, which seriously affects its reliability and subsequent applications.

For example, solid-state reaction technique using physical mixing of the constituent element source materials has several disadvantages particularly for multi component oxide system such as $(Bi,Pb)_2Sr_2Ca_2Cu_3O_{10+x}$ due to transport limitations and segregations etc. in addition to very long total heating processing times from 250 to 350 hours.

On the other hand, co-precipitation, sol-gel methods using chemical mixing of the constituent elements although serve to reduce the particle size of the same components (thereby leading to shorter heating durations) used in the solid state method, however, both the methods lead to similar problems of carbonate formation due to use of oxalic acid in the former method and citric or acetic acid in the latter method.

Another impurity (dopants/additives) incorporation method although a well known, one, but has been tried in small pellet samples of Bi-2223. A variety of such dopants/additives are: Li, Mg, Sb Ni, V, Ba, Pt, Au, Ag etc. [Kroger et. al., U.S. Pat. No. 5,395,821, Iino et. al. U.S. Pat. No. 5,108,985; C. W. Chu et. al., Phys. Rev. Lett.; Vol. 40, p 8840 (1989); S. Kambe et. al; Supercond. Sci. Technol. Vol. 11, p 1061 (1998); U.S. Pat. No. 6,209, 190; A. Maqsood et. al; J. Mater. Sci. vol. 27, p 5330 (1992); I. H. Gul et. al; Physica C, vol. 432, p 71 (2005); S. Jin et. al Phys. Rev., Vol. B37, p 7850, (1988); T. E. Jones et. al; Phys. Rev; Vol. B41, pp. 7197, (1990); T. Matsushita, Supercond. Sci. Technol., vol. 7, p 222, (1994), J. C. Grivel and R. Flukiger, Physica C, Vol. 229, p 177, (1994) and H. Comert et. al. Supercond. Sci. Technol., Vol. 7, p 284, 1994)] and have been found to improve the $J_c$. Then reporting an increase in $J_c$ in the case of dopants case and also in the case of additives case. However, reduction in $R_c$ is reported generally in the case of additives. Further, among all above noble metal and Mg etc. additives, a certain amount of Ag is reported to be not only non-poisonous to HTS but also to be the most effective in enhancing $J_c$ and at the same time in decreasing $R_c$. [(T. D. Dzhafarov et. al., J. Alloys Comp., vol. 221, p 246 (1995); T. Matsushita et. al., Supercond. Sci. Technol. Vol. 7, p. 222, 1994)]. This is because Ag lowers melting point of Bi-2223 material, thereby improves sintering and facilitate the desired Bi-2223 phase formation, it fills grain boundaries/voids and act as a parallel conduction path thereby improves $J_c$ and lowers contact resistance.

Based upon beneficial role of silver additive, Yamada et. al. in Supercond. Sci. Technol. vol4, p. 165(1991) reported an enhancement in Jc for 2.5 to 50 cm long samples of Ag-added Bi-2223 tapes.

In another reference: Bismuth-Based High-Temperature superconductors Ed. By H. Maeda and T. Togano; p. 253 (1996), Michishita et. al. reported a three times increase in critical current ($I_c$) and a three orders of magnitude lower contact resistivity ($R_c$) on adding 10 wt % silver. Although the obtained $I_c$ of 177 A is reasonably good, however, the obtained Rc of the order of $10^{-5}$-$10^{-6}$ Ohm-Cm$^2$ at 77 K in zero field is still high. Moreover, these reports are on low-$T_c$ Bi-2212 rod current leads.

Despite many studies on silver added Bi-2223 superconducting material have been conducted on small pellet samples and few studies on tapes, however, such a problem is not solved yet for bulk current leads. Moreover, in both these methods, Ag was added in the calcined powder, which is generally prepared from solid-state method. This method has the drawback of producing not only the coarse and inhomogeneous calcined powder but also has the draw back of non-uniform mixing of Ag, which affects superconductivity of the end product.

The drawbacks of the above process can be improved by employing solution technique, which ensures uniform mixing of the constituent elements at atomic level. These methods are freeze-drying [U.S. Pat. No. 5,523,285] and spray drying methods [Van et. al. Supercond. Sci. Technol. Vol. 9, 843 (1996); Bruneel et. al. Supercond. Sci. Technol. Vol. 11, 88 (1998).] which ensures uniform mixing of the constituent elements at atomic level. However, among these two, the former method being complicated and extra sensitive to nitrate ion concentration and pH of the solution has the disadvantage of producing a hygroscopic mixed powder if the pH is outside the narrow range (0.3-0.7). The latter method on the other hand is simple and is not pH sensitive.

Reference may be made to S. N. Ekbote et. al. in Bull. Mater. Sci., vol. 24, p. 603 (2001), wherein is disclosed a method for fabrication of Bi-2223 bulk tube current leads with addition of silver (from 0 to 25 wt. %) in the starting solution of raw material having Bi:Pb:Sr:Ca:Cu in the ratio of 1.84:0.4:2.2:2:3. Spray drying method for starting mixed powder and multiple heatings at different temperatures with intermediate grindings for calcined powder preparation. Cold isopressing for tube making. Both initial and final sintering in the tube of same dimension: L=200 mm, O.D.=30 mm and I.D.=28 mm with one intermediate crushing and ball milling. Post sintering method using air drying silver paste wrapped with a silver foil (two layers) for both end contacts. It has taught that a chemically homogeneous calcined powder can be produced by this process. Then reporting maximum transport current (not less than 120 Amp) and lowest contact resistance in $10^{-5}$-$10^{-6}$ ohm range ~ for 10 wt. % Ag added tube leads at 77 K in zero-field. Although, the calcined powder was homogeneous, however, the obtained contact resistance values of the final tube current leads are not sufficiently low. This method has the drawback of making not very good contacts.

Further, although pure Bi-2223 bulk tube current leads of with current carrying capability ranging from 35 to 1500 A (critical current density, $J_c$ varying from 500 to 850 A/cm$^2$) and contact resistance of the order of $10^{-6}$ Ohms at 77 K in self-field are commercially available by a number of companies worldwide like CAN Superconductors/Marke Tech International Inc., Sumitomo Heavy Indus. Ltd., Kobe Steel, Fuji Electric, Kyushu Electric, Mitsubishi and Showa Electric wire and cable and others, for applications such as in LTS magnets and SMES, however, no data related to mechanical properties such as fracture strength (?) which is also one of the very important and a crucial parameter, besides electrical properties $J_c$ and Rc, particularly for use of such large bulk leads made from brittle HTS materials has been reported.

In prior art methods, to obtain Bi-2223 bulk current leads, no silver modified superconducting material is used, purity of the raw materials used is 99.9% or more, composition (Bi, Pb):Sr:Ca:Cu in molar ratio of 2:2:2:3 which rarely lead to desired single phasic Bi-2223 material is used, generally very long (250-350 total heating hours) solid state route. Expensive post/co-sintered one or two-layer sputtered/evaporated silver method for both end contacts which generally lead to contact resistance in micro ohm range. Oxygen partial pressure as heating atmosphere is used. This not only increases the total cost of the product but also hampers reproducibility of the data (because of inhomogeneous end product due to starting chemically inhomogeneous powder), particularly obtained from such large bulk sintered end product. Thus, there is a definite need to provide an improved process for the preparation of Bi-2223 bulk suitable for making low-cost high current leads.

From the prior art methods, it is clear that to obtain Bi-2223 bulk current leads, no silver modified superconducting material is used, purity of the raw materials used is 99.9% or more, composition (Bi,Pb):Sr:Ca:Cu in molar ratio of 2:2:2:3 which rarely lead to desired single phasic Bi-2223 material is used, generally very long (200-300 hours) solid state route which involves physical mixing of raw materials is used to obtain starting powder for the preparation of calcined powder as a precursor for superconducting material. Such technique and other techniques like co-precipitation, sol gel, do not lead to chemically homogeneous powder. Expensive post/co-sintered one or two-layer sputtered/evaporated silver method for both end contacts and oxygen partial pressure as heating atmosphere is used. This not only increases the total cost of the product but also hampers reproducibility of the data (because of inhomogeneous end product due to starting chemically inhomogeneous powder), particularly obtained from such large bulk sintered end product. Thus, there is a definite need to provide an improved process for the preparation of Bi-2223 bulk suitable for making low-cost high current leads.

From the hitherto known prior art, as detailed above, it is clear that there is a definite need to develop a process for the preparation of high temperature superconducting (HTS) bulk current leads with improved properties and superconducting bulk current leads made thereby.

The main object of the present invention is to provide a process for the preparation of high temperature superconducting (HTS) bulk current leads with improved properties and superconducting bulk current leads made thereby, which obviates the drawbacks as detailed above.

Another object of the present invention is to provide a process for the preparation of high temperature superconducting (HTS) bulk current leads with improved properties from an improved high temperature superconducting (HTS) bismuth based cuperate [(Bi, Pb)$_2$ Sr$_2$Ca$_2$Cu$_3$O$_{10+x}$] and superconducting bulk current leads made thereby, which obviates the drawbacks as detailed above.

Yet another object of the present invention is to provide an improved process for the development of High temperature superconducting (HTS) bulk current leads of different sizes useful for cryogen free cryocooler and other superconducting magnet systems that needs to be energized with a continuous current of more than 200 A.

Still another object of the present invention is to provide a method of preparation of HTS current leads with reduced contact resistivity, increased transport current and increased fracture strength of HTS itself constituting the current lead.

Still yet another object of the present invention is to have a chemically mixed starting powder of the constituent raw materials inclusive of silver right in the raw materials stage to obtain homogeneity at atomic level in a single step in large quantity by using spray drying method, which rarely can be obtained by prior art methods. Thereby, not only can improve the quality of the superconducting material but can also reduce the total duration of the entire process.

A further object of the present invention is to use nominal compositions: Bi$_{1.74-1.84}$Pb$_{0.34-0.40}$Sr$_{1.83-2.0}$ Ca$_{1.97-2.2}$Cu$_{3.0-3.13}$ which lead to single phasic Bi-2223 material.

A still further object of the present invention is to sinter first by a process not involving several steps requiring for making several tubes/rods of different size.

A yet further object of the present invention is to give all the heat treatments in air rather than in a low oxygen partial pressure, which further can reduce the cost.

Another object of the present invention is to use low cost and easily available raw materials (98% pure) rather than more expensive 99.9% pure raw materials used in prior art methods.

In another object of the present invention is to use a co-sintered three layer low cost and low contact resistance process for end electrode contacts.

A further object of the present invention is to provide a process of preparation of improved Bi-2223 tube current leads with improved properties.

A still further object of the present invention is to provide a method of preparation of improved Bi-2223 rod current leads with improved properties.

Another object of the present invention is to provide a bulk current lead with improved properties such as continuous transport current of more than 200 A, end contact resistivity not more than 1 ?Ohm-cm$^2$ and fracture strength not less than 100 MPa.

In the present invention there is provided a process for the preparation of high temperature superconducting (HTS) bulk current leads with improved properties from an improved high temperature superconducting (HTS) bismuth based cuperate [(Bi, Pb)$_2$Sr$_2$Ca$_2$Cu$_3$O$_{10+x}$] and superconducting bulk current leads made thereby. In this, the said current lead is of a (Bi, Pb)$_2$Sr$_2$Ca$_2$Cu$_3$O$_{10+x}$ superconducting material in tube and rod shape with both end silver metallic contacts. To produce such a lead, the process included modification of the superconducting material with homogeneous silver addition in the starting raw material, a step of initial sintering in a large size tube followed by crushing into powder, a step of shaping the said initially sintered tube powder into tubes and rods of different size, a step of formation of metallic contacts by a perforated silver foil sandwiched between two metal spray deposited silver at both end parts of the said tubes and rods followed by a final step of co-sintering. In the current leads obtained according to these aspects, it is possible to stably carry current more than 200 A required for energizing the superconducting magnet systems.

In the present invention there is provided an improved process wherein by addition of silver in the starting raw material, the $(Bi,Pb)_2Sr_2Ca_2Cu_3O_{10+x}$ [(Bi,Pb)-2223] bulk current obtained has improved properties, such as increase in critical current density, decrease in contact resistance and increase in fracture strength.

In the present invention the first step is to have a chemically mixed starting powder of the raw materials of the constituent elements and of the additive silver to obtain homogeneity at atomic level in a single step in large quantity by using spray drying method, which rarely can be obtained by prior art solid state method of physical mixing of individual raw materials even after several intermediate grindings. Thereby, not only can improve the quality of the superconducting material but can also reduce the total duration of the entire process. Further, in processing of the material for the preparation of bulk current leads, initial sintering is carried out of the calcined powder in a single tube of large size for both the final tubes as well as rods and making of a three layer silver metal contacts of a perforated silver foil sandwiched between two metal spray deposited silver layers.

In the present invention is provided a process for the preparation of high temperature superconducting (HTS) bulk current leads with improved properties from an improved high temperature superconducting (HTS) bismuth based cuperate [(Bi, Pb)$_2$ Sr$_2$Ca$_2$Cu$_3$O$_{10+x}$] and superconducting bulk current leads made thereby, comprising : a step of preparing separate metal cation solutions of Bi, Pb, Sr, Ca and Cu and mixing the solution so obtained, a step of adding silver cation solution in the said mixed solution, a step of spray drying the said resultant metal cation solution to obtain a starting powder, a step of calcining the said spray dried powder to obtain a homogeneous precursor calcined powder for sintering, a step of cold isopressing of said homogeneous calcined powder into a tube shape followed by subsequent initial sintering, a step of crushing and mixing the said initially sintered tube to obtain a homogeneous initially sintered superconducting tube powder material, a step of cold isopressing of the said homogeneous initially sintered superconducting powder material into final tubes and/or rods of different size, a step of making grooves at both ends of the said tubes and rods, a step of making silver contacts, and a step of final co-sintering of said assembly of tube/rod and silver contacts, to thereby obtain a bulk current lead.

Accordingly, the present invention provides a process for the preparation of high temperature superconducting (HTS) bulk current leads with improved properties which comprises:
(i) preparing separate water-based solutions of nitrates of Bi, Pb, Sr, Ca and Cu and then mixing the solutions together to form a single solution;
(ii) adding silver in the form of water-based silver nitrate solution in the single solution (i) to obtain a resultant nitrate solution;
(iii) spray drying the resultant nitrate solution obtained in step (ii) to obtain a spray-dried powder;
(iv) calcining the spray dried powder to obtain a homogeneous calcined powder;
(v) cold isopressing (CIP) of the calcined powder into a large size tube of length of upto 500 mm, outer diameter upto 150 mm and wall thickness in the range of 2to 10 mm;
(vi) initial sintering of the cold isostatically pressed tube of step (v)
(vii) grinding the initially sintered high temperature superconductor (HTS) tube into powder and mixing to obtain a homogenous initially sintered tube powder;
(viii) cold isopressing(CIP) of the said homogenous initially sintered tube powder obtained in step (vii) into final tubes and rods;
(ix) making of grooves at both ends of the said tubes and rods;
(x) making of metal contacts, such as three layer, on both end grooves;
(xi) final co-sintering of the assembly of tube/rod and silver contacts.

In an embodiment of the present invention, the nitrates of Bi, Pb, Sr, Ca, Cu and Ag are of 98% purity.

In another embodiment of the present invention, the nitrates of Bi, Pb, Sr, Ca and Cu are in a molar ratio in the range of 1.74 to 1.84:0.34 to 0.4:1.83 to 2.0:1.97 to 2.2:3.0 to 3.13.

In yet another embodiment of the present invention, the silver nitrate is in molar ratio in the range of 0.6 to 1.8.

In still another embodiment of the present invention the high temperature superconductor is silver added (Bi, Pb)-2223.

In a further embodiment of the present invention, the calcination of the starting spray dried powder containing Ag is effected at a temperature of the order of 800°±10° C. in air for a period of the order of one hour to obtain a precursor powder for sintering.

In another embodiment of the present invention, the cold isopressing of the calcined powder into a large size tube is effected at a pressure in the range of 100 to 300 MPa.

In yet another embodiment of the present invention, the size of the tube obtained from cold isostatically pressed calcined powder is of length of the order of 430 mm, outer diameter of the order of 50 mm and wall thickness in the range of 2 to 3 mm.

In still another embodiment of the present invention, the initial sintering of the cold isostatically pressed tube is carried out at a temperature in the range of 830° to 850° C. in air for a period in the range of 60 to 100 hours.

In still yet another embodiment of the present invention, the grinding of the initially sintered high temperature superconductor (HTS) tube into powder and mixing is effected by known methods.

In a further embodiment of the present invention, the cold isopressing (CIP) of initially sintered tube powder into final tubes/rods, respectively, is done at a pressure in the range of 200 to 400 MPa.

In a still further embodiment of the present invention, the forming of metallic contacts at both end parts of said tube or rod consists of making grooves at both ends of the superconductor, depositing a first silver layer by metal spray gun, wrapping a perforated silver foil on the said silver layer, depositing a second silver layer by a metal spray gun on the said perforated silver foil; co-sintering the said combination of first silver layer, wrapped silver foil and second silver layer at a temperature in a range of 830° to 850° C. in air for a time period in the range of 100 to 150 hours, to obtain a current lead.

Accordingly, the present invention provides superconducting bulk current leads useful for cryogen free cryocoolers and other superconducting magnet systems made by the process described herein above.

In an embodiment of the present invention, the critical current density (Jc) of the superconducting bulk tube and rod current leads is in the range of 366 to 1166 A/cm$^2$ at 77 K in self-field.

In another embodiment of the present invention, the contact resistivity of the superconducting bulk tube and rod current leads is in the range of 0.010 to 0.039? ohm cm$^2$ at 77 K in self-field.

In a still another embodiment of the present invention, the fracture strength of the superconducting bulk tube and rod current leads is in the range of 122 to 170 MPa.

In a yet another embodiment of the present invention, the high temperature superconductor (HTS) current lead contacts are capable of carrying a continuous current of more than 200 A, at least for a period of 2 to 4 hours without adding any substantial heat load to the cryogen used to cool the HTS.

In a still yet another embodiment of the present invention, the reproducibility of the superconducting bulk current leads, useful for cryogen free cryocoolers and other superconducting magnet systems, is of the order of more than 60% in 160 to 250 hours of total heating duration.

In a further embodiment of the present invention, the final high temperature superconductor bulk current lead is a hollow cylindrical tube of outer diameter (O.D.) in the range of 10 to 35 mm, length in the range of 100 to 400 mm and wall thickness in the range of 2 to 3 mm.

In a still further embodiment of the present invention, the final high temperature superconductor current lead is a solid rod of diameter in the range of 2 to 10 mm and length in the range of 100 to 200 mm.

In the present invention there is provided a process for the preparation of high temperature superconducting (HTS) bulk current leads with improved properties from an improved high temperature superconducting (HTS) bismuth based cuperate [(Bi, Pb)$_2$Sr$_2$Ca$_2$Cu$_3$O$_{10+x}$] and superconducting bulk current leads made thereby. The process comprises of preparing a precursor powder of high temperature superconductor of (Bi,Pb)$_2$Sr$_2$Ca$_2$Cu$_3$O$_{10+x}$ [(Bi,Pb)-2223] with addition of Ag from spray drying method with an immediate calcination at a temperature of 800°±10° C. in air for one hour, shaping the calcined powder into an upto 500 mm long tube (O.D.~50 mm), sintering the said tube at temperatures from 830° to 850° C. in air for 60 to 100hrs., grinding the said initially sintered tube into powder, shaping the said initially sintered tube ground powder into a final tube or rod, making grooves at both ends of the said final tube or rod, making a silver metallic contact on the said grooves, co-sintering finally the said assembly of tube or rod and a metallic contact at temperatures from 830° to 850° C. in air for 100 to 150 hours resulting in current leads having properties such as: Jc in the range of 366 to 1166 A/cm$^2$, contact resistivity in the range of 0.010 to 0.039? ohm·cm$^2$ at 77 K and in self-field and fracture strength in the range of 122 to 170 MPa.

The high temperature superconductor (HTS) (Bi,Pb)-2223 to be used is a current lead. In the case of such HTS compositions: $Bi_{1.74-1.84}Pb_{0.34-0.4}Sr_{1.83-2.0}Ca_{1.97-2.2}Cu_{3.0-3.13}$, are selected to obtain a single phasic Bi-2223 superconducting material.

The novelty of the process of the present invention for the preparation of high temperature superconducting (HTS) bulk current leads with improved properties from an improved high temperature superconducting (HTS) bismuth based cuperate [(Bi, Pb)$_2$Sr$_2$Ca$_2$Cu$_3$O$_{10+x}$] and superconducting bulk current leads made thereby, lies in the improvement of material properties, such as increase in critical current density, increase in fracture strength and decrease in contact resistance. Further, there is reduction in overall process time by about 100 hours.

The novelty of the process of the present invention for the preparation of high temperature superconducting (HTS) bulk current leads with improved properties from an improved high temperature superconducting (HTS) bismuth based cuperate [(Bi, Pb)$_2$Sr$_2$Ca$_2$Cu$_3$O$_{10+x}$] and superconducting bulk current leads made thereby, has been achieved by the non obvious inventive steps of:

1. modification of the superconducting material with homogeneous silver addition in the starting raw material itself;
2. initial sintering of a single large size tube instead of a number of smaller tubes resulting in increased homogeneity and reduction in total process time, specially reduction in sintering time;
3. three layer end contacts rather than a single or two layer contact.

Thus the novel characteristics have been achieved by the non obvious inventive steps of modifying the basic (Bi, Pb)-2223 material by silver addition at atomic level, and by following simple/minimum steps as detailed herein above.

Figure 1B:
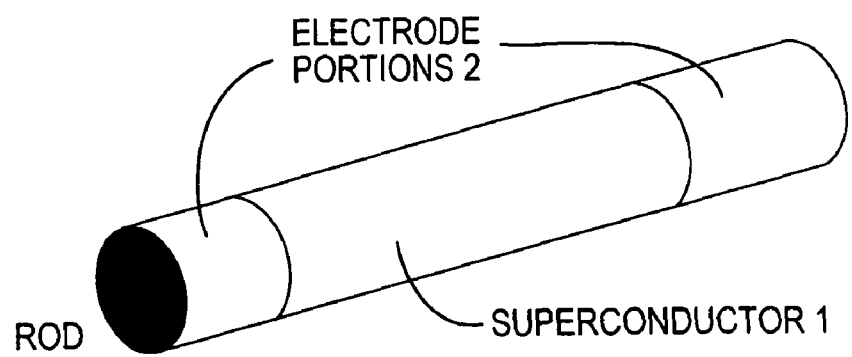

In FIG. 1(a) & 1(b) of the drawings accompanying this specification are shown (a) complete tube HTS current lead and (b) complete rod HTS current lead. In this figure, reference numeral 1 designates a (Bi, Pb)$_2$Sr$_2$Ca$_2$Cu$_3$O$_{10+x}$ superconductor; and numeral 2 designates: silver metal electrode portion.

Figure 2:
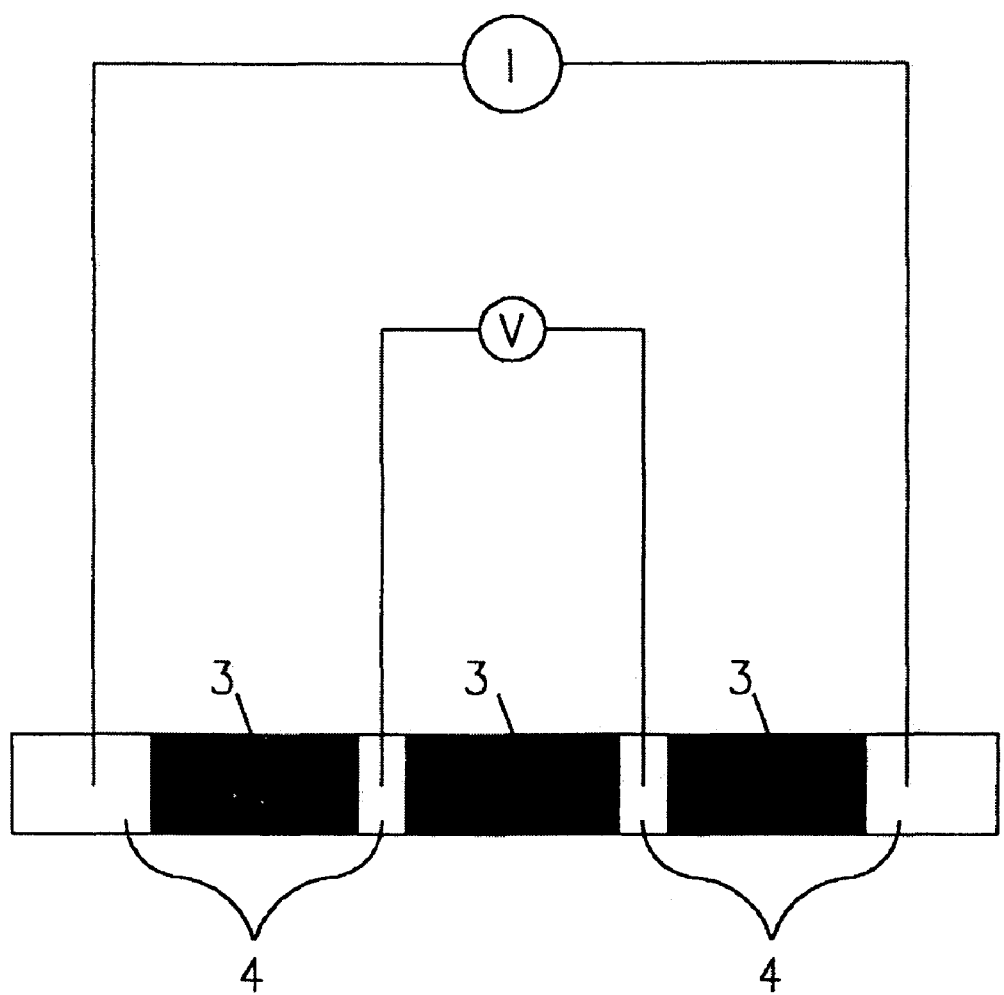
Figure 3:
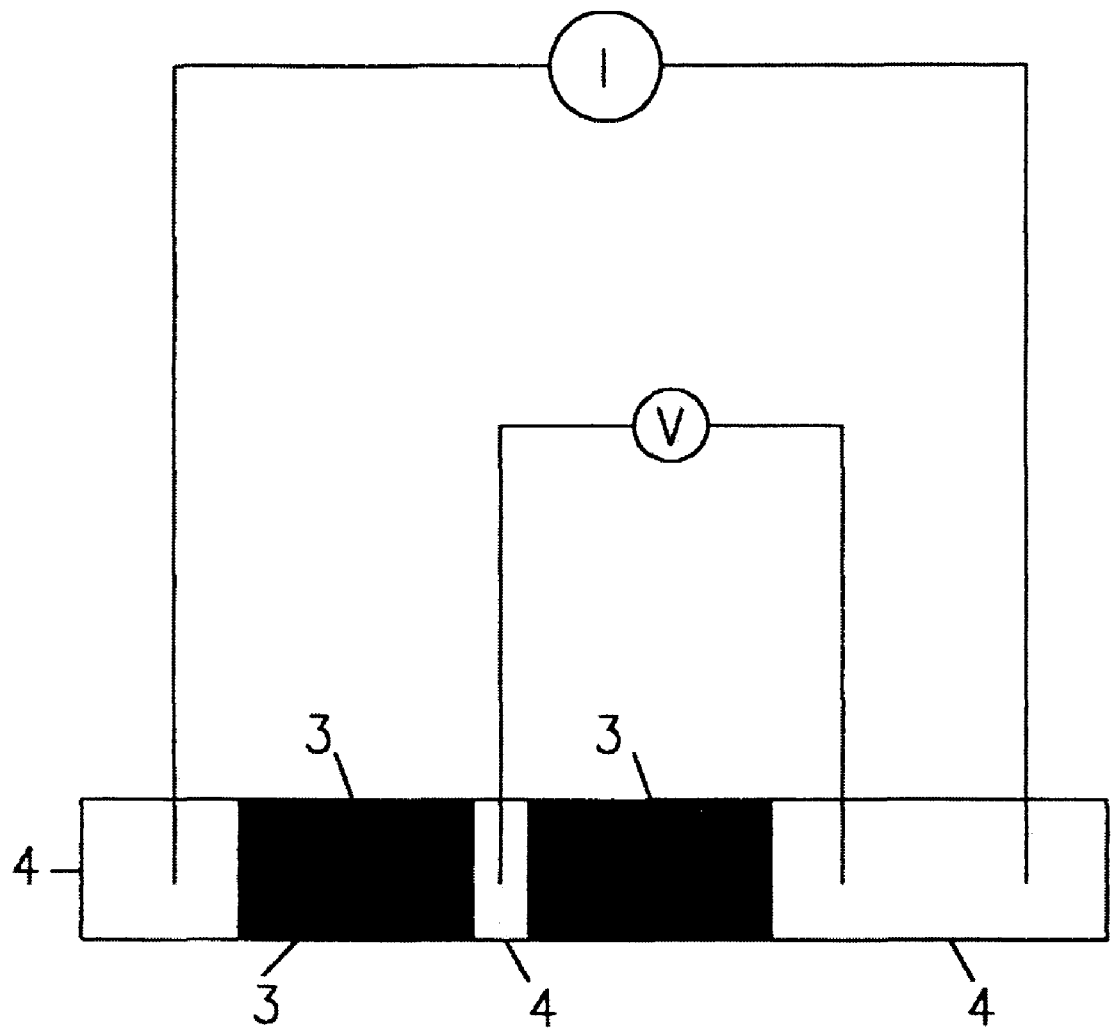

The critical current density ($J_c$) and the contact resistivity of the silver added tube/rod current leads prepared by the process of the present invention described herein above were measured by four-terminal method as illustrated in FIGS. 2 and 3 of the drawings accompanying this specification. All the four terminals (2) made on the superconductor portion (1) were of silver. The outer terminals (electrode portion) were current terminals and the inner two terminals were voltage terminals.

FIG. 2 of the drawings shows a schematic of the set-up for measurement of the critical current density of a current lead according to the embodiment of the present invention, wherein reference numeral (1) is the silver metal electrode portion and reference numeral (2) is Bi, Pb)$_2$Sr$_2$Ca$_2$Cu$_3$O$_{10+x}$ superconductor.

FIG. 3 of the drawings shows a schematic of the set-up for measurement of the electrode portion contact resistivity of the current leads according to the embodiment of the present invention wherein reference numeral (1) is the silver metal electrode portion and reference numeral (2) is Bi, Pb)$_2$Sr$_2$Ca$_2$Cu$_3$O$_{10+x}$ superconductor.

In four-probe method, for voltage taps, air-drying silver paste was used and connecting copper leads were soldered directly to the superconductor close to the current contact. Accuracy of the measurements was about ±10%. The measurements were at a sample temperature of 77 K and 4.2 K.

Further, fracture strength (σ) was measured on rings of 3 to 5 mm width cut from finally sintered tubes and circular disks of 3 to 5 mm thickness cut from rods.

The following examples are given by way of illustration and therefore should not be construed to limit the scope of the present invention.

EXAMPLE-1

Precursor powder without silver was prepared by weighing each raw material nitrate powder of the constituent elements Bi, Pb, Sr, Ca, and Cu in mole ratio of 1.84:0.35:1.91:2.05:

3.05. These were dissolved in double distilled water. This nitrate solution was spray dried to get a homogeneous starting powder. This powder was then calcined immediately in air for 1 hour in an electric furnace already set at 800° C. Thus, the pure precursor powder for sintering was obtained.

The pure calcined powder was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a pure tube of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small unwrapped portion for making external contacts, another silver layer was metal spray deposited.

This entire assembly, that is, the tube with both ends silver contact was finally sintered in air for 100 hours to obtain a pure (Bi,Pb)-2223 tube current lead of length=320 mm. Contact resistivity of this tube at 77 K in zero-magnetic field was measured and the value achieved was 0.204 µOhm-cm$^2$. At that time, the critical current ($I_c$) measured was 158 A. If converted this critical current to a critical current density (Jc), the obtained $J_c$ was 375 A/cm$^2$ and the fracture strength was 98 MPa. The obtained results are shown in Table 1.

EXAMPLE-2

Precursor powder without silver was prepared by weighing each raw material nitrate powder of the constituent elements Bi, Pb, Sr, Ca, and Cu are in mole ratio of 1.84:0.35:1.91:2.05:3.05. These were dissolved in double distilled water. This nitrate solution was spray dried to get a homogeneous starting powder. This powder was then calcined immediately in air for 1 hour in an electric furnace already set at 800° C. Thus, the pure precursor powder for sintering was obtained.

The pure calcined powder was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material.

Then a pure tube of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small unwrapped portion for making external contacts, another silver layer was metal spray deposited.

This entire assembly, that is, the tube with both ends silver contact was finally sintered in air for 100 hours to obtain a pure (Bi,Pb)-2223 tube current lead of length=320 mm. Contact resistivity of this tube at 4.2 K in zero-magnetic field was measured and the value achieved was 0.036 µOhm-cm$^2$. At that time, the critical current density (Jc) was 2500 A/cm$^2$. The obtained results are shown in Table 1.

EXAMPLE-3

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 0.6. These were dissolved in double distilled water. This nitrate solution was spray dried to get a homogeneous starting powder with uniform Ag addition in 0.6 Mole ratio. This powder was then calcined immediately in air for 1 hour in an electric furnace already set at 800° C. Thus, the precursor powder with Ag in 0.6 Mole ratio was obtained for sintering.

This precursor powder with Ag in 0.6 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube with Ag in 0.6 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 0.6 Mole ratio of length=320 mm.

Contact resistivity of this tube at 77 K in zero-magnetic field was measured and the value achieved was 0.052µOhm-cm$^2$. At that time, the critical current ($I_c$) was 226 A. If converted this initial current to a critical current density (Jc), the obtained $J_c$ was 537 A/cm$^2$ and the fracture strength was 132 MPa. The obtained results are shown in Table 1.

EXAMPLE-4

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 0.6. These were dissolved in double distilled water. This nitrate solution was spray dried to get a homogeneous starting powder with uniform Ag addition in 0.6 Mole ratio. This powder was then calcined immediately in air for 1 hour in an electric furnace already set at 800° C. Thus, the precursor powder with Ag in 0.6 Mole ratio was obtained for sintering.

This precursor powder with Ag in 0.6 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube with Ag in 0.6 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 0.6 Mole ratio of length=320 mm.

Contact resistivity of this tube at 4.2 K in zero-magnetic field was measured and the value achieved was 0.005μOhm-cm$^2$. At that time, the critical current density (Jc) was 5320 A/cm$^2$. The obtained results are shown in Table 1.

EXAMPLE-5

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material.

Then a tube with Ag in 1.2 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 1.2 Mole ratio of length=320 mm.

Contact resistivity of this tube at 77 K in zero-magnetic field was measured and the value achieved was 0.037 μOhm-cm$^2$. At that time, the critical current ($I_c$) measured was 299 A. If converted this critical current to a critical current density (Jc), the obtained $J_c$ was 712 A/cm$^2$ and the fracture strength was 145 MPa. The obtained results are shown in Table 1.

EXAMPLE-6

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube with Ag in 1.2 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 1.2 Mole ratio of length=320 mm.

Contact resistivity of this tube at 4.2 K in zero-magnetic field was measured and the value achieved was 0.0031 μOhm-cm$^2$. At that time, the critical current density (Jc) was 7530 A/cm$^2$. The obtained results are shown in Table 1.

EXAMPLE-7

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.8. These were dissolved in double distilled water. This nitrate solution was spray dried to get a homogeneous starting powder with uniform Ag addition in 1.8 Mole ratio. This powder was then calcined immediately in air for 1 hour in an electric furnace already set at 800° C. Thus, the precursor powder with Ag in 1.8 Mole ratio was obtained for sintering.

This precursor powder with Ag in 1.8 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube with Ag in 1.8 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 1.8 Mole ratio of length=320 mm.

Contact resistivity of this tube at 77 K in zero-magnetic field was measured and the value achieved was 0.039 μOhm-cm$^2$. At that time, the critical current ($I_c$) measured was 258 A.

If converted this critical current to a critical current density (Jc), the obtained $J_c$ was 615 A/cm$^2$ and the fracture strength was 138 MPa. The obtained results are shown in Table 1.

EXAMPLE-8

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.8. These were dissolved in double distilled water. This nitrate solution was spray dried to get a homogeneous starting powder with uniform Ag addition in 1.8 Mole ratio. This powder was then calcined immediately in air for 1 hour in an electric furnace already set at 800° C. Thus, the precursor powder with Ag in 1.8 Mole ratio was obtained for sintering.

This precursor powder with Ag in 1.8 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube with Ag in 1.8 Mole ratio of length=320 mm, outer diameter=12.4 mm and inner diameter=10 mm was obtained by cold isopressing of this initially sintered powder at a pressure of 400 MPa. At both ends of this tube, 25 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead with Ag addition in 1.8 Mole ratio of length=320 mm.

Contact resistivity of this tube at 4.2 K in zero-magnetic field was measured and the value achieved was 0.004 μOhm-cm$^2$. At that time, the critical current density (Jc) was 6300 A/cm$^2$. The obtained results are shown in Table 1.

EXAMPLE-9

Precursor powder with silver was prepared by weighing each raw material nitrate powder of the constituent elements Bi, Pb, Sr, Ca, and Cu in mole ratio of 1.74:0.34:1.83:1.97:3.13 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead having 1.2 Mole ratio of Ag and of length=220 mm.

Contact resistivity of this tube at 77 K in zero-magnetic field was measured and the value achieved was 0.027 μOhm-cm$^2$. At that time, the critical current ($I_c$) measured was 595 A. If converted this critical current to a critical current density (Jc), the obtained $J_c$ was 633 A/cm$^2$ and the fracture strength was 153 MPa. The obtained results are shown in Table 1.

EXAMPLE-10

Precursor powder with silver was prepared by weighing each raw material nitrate powder of the constituent elements Bi, Pb, Sr, Ca, and Cu in mole ratio of 1.74:0.34:1.83:1.97:3.13 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited. This entire assembly, that is, the tube with both ends silver contact was finally sintered in air for 100 hours to obtain a (Bi,Pb)-2223 tube current lead having 1.2 Mole ratio of Ag and of length=220 mm.

Contact resistivity of this tube at 4.2 K in zero-magnetic field was measured and the value achieved was 0.0022 μOhm-cm$^2$. At that time, the critical current density (Jc) was 6170 A/cm$^2$. The obtained results are shown in Table 1.

EXAMPLE-11

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead having 1.2 Mole ratio of Ag and of length=220 mm.

Contact resistivity of this tube at 77 K in zero-magnetic field was measured and the value achieved was 0.023 μOhm-cm$^2$. At that time, the critical current ($I_c$) measured was 650 A.

If converted this critical current to a critical current density (Jc), the obtained $J_c$ was 691 A/cm$^2$ and the fracture strength was 160 MPa. The obtained results are shown in Table 1.

EXAMPLE-12

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead having 1.2 Mole ratio of Ag and of length=220 mm.

Contact resistivity of this tube at 4.2 K in zero-magnetic field was measured and the value achieved was 0.001 μOhm-cm$^2$. At that time, the critical current density (Jc) was 7234 A/cm$^2$. The obtained results are shown in Table 1.

EXAMPLE-13

Precursor powder with silver was prepared by weighing each raw material nitrate powder of the constituent elements Bi, Pb, Sr, Ca, and Cu in mole ratio of 1.84:0.4:2.0:2.2:3.0 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead having 1.2 Mole ratio of Ag and of length=200 mm.

Contact resistivity of this tube at 77 K in zero-magnetic field was measured and the value achieved was 0.025 μOhm-cm$^2$. At that time, the critical current ($I_c$) measured was 555 A. If converted this critical current to a critical current density (Jc), the obtained $J_c$ was 590 A/cm$^2$ and the fracture strength was 155 MPa. The obtained results are shown in Table 1.

EXAMPLE-14

Precursor powder with silver was prepared by weighing each raw material nitrate powder of the constituent elements Bi, Pb, Sr, Ca, and Cu in mole ratio of 1.84:0.4:2.0:2.2:3.0 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a tube of length=220 mm, outer diameter=30.8 mm and inner diameter=28.8 mm having Ag in 1.2 Mole ratio was obtained by cold isopressing of this initially sintered material at a pressure of 400 MPa. At both ends of this tube, 20 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a (Bi,Pb)-2223 tube current lead having 1.2 Mole ratio of Ag and of length=200 mm.

Contact resistivity of this tube at 4.2 K in zero-magnetic field was measured and the value achieved was 0.0012 μOhm-cm$^2$. At that time, the critical current density ($J_c$) was 5946 A/cm$^2$ The obtained results are shown in Table 1.

EXAMPLE-15

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a Ag added (1.2 Mole ratio) tube of length=120 mm, outer diameter=12.4 mm and inner diameter=10 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a Ag added (1.2 Mole ratio) (Bi,Pb)-2223 tube current lead of length=120 mm.

Contact resistivity of this tube at 77 K in zero-magnetic field was measured and the value achieved was 0.035 µOhm-cm². At that time, the critical current ($I_c$) measured was 299 A. If converted this critical current to a critical current density (Jc), the obtained $J_c$ was 712 A/cm² and a fracture strength of 147 MPa. The obtained results are shown in Table 1.

EXAMPLE-16

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material.

Then a Ag added (1.2 Mole ratio) tube of length=120 mm, outer diameter=12.4 mm and inner diameter=10 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a Ag added (1.2 Mole ratio) (Bi,Pb)-2223 tube current lead of length=120 mm.

Contact resistivity of this tube at 4.2 K in zero-magnetic field was measured and the value achieved was 0.003 µOhm-cm². At that time, the critical current density (Jc) was 7530 A/cm², The obtained results are shown in Table 1.

EXAMPLE-17

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a Ag added (1.2 Mole ratio) tube of length=400 mm, outer diameter=35.0 mm and inner diameter=33.0 mm was obtained by cold isopressing of this initially sintered powder at a pressure of 400 MPa. At both ends of this tube, 40 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, the tube with both ends silver contact was finally sintered in air for 100 hours to obtain a Ag added (1.2 Mole ratio) (Bi,Pb)-2223 tube current lead of length=400 mm.

Contact resistivity of this tube at 77 K in zero-magnetic field was measured and the value achieved was 0.033 µOhm-cm². At that time, the critical current ($I_c$) measured was 750 A. If converted this critical current to a critical current density (Jc), the obtained $J_c$ was 702 A/cm² and a fracture strength of 170 MPa. The obtained results are shown in Table 1.

EXAMPLE-18

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=100 mm and diameter=2 mm was obtained by cold isopressing of this initially sintered powder at a pressure of 400 MPa. At both ends of this tube, 5 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=100 mm.

Contact resistivity of this rod at 77 K in zero-magnetic field was measured and the value achieved was 0.01 µOhm-cm². At that time, the critical current ($I_c$) measured was 35 A. If converted this critical current to a critical current density (Jc), the obtained $J_c$ was 1166 A/cm$^2$ and a fracture strength of 128 MPa. The obtained results are shown in Table 1.

EXAMPLE-19

Precursor powder with silver was prepared by weighing each raw material nitrate powder of the constituent elements Bi, Pb, Sr, Ca, and Cu in mole ratio of 1.84:0.35:1.91:2.05: 3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=120 mm and diameter=4 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=120 mm.

Contact resistivity of this rod at 77 K in zero-magnetic field was measured and the value achieved was 0.01 µOhm-cm$^2$. At that time, the critical current ($I_c$) measured was 138 A. If converted this critical current to a critical current density (Jc), the obtained $J_c$ was 1150 A/cm$^2$ and a fracture strength of 122 MPa. The obtained results are shown in Table 1.

EXAMPLE-20

Precursor powder with silver was prepared by weighing each raw material nitrate powder of the constituent elements Bi, Pb, Sr, Ca, and Cu in mole ratio of 1.84:0.35:1.91:2.05: 3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=120 mm and diameter=4 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=120 mm.

Contact resistivity of this rod at 4.2 K in zero-magnetic field was measured and the value achieved was 0.0015µOhm-cm$^2$. At that time, the critical current density (Jc) was 10750 A/cm$^2$. The obtained results are shown in Table 1.

EXAMPLE-21

Precursor powder with silver was prepared by weighing each raw material nitrate powder of the constituent elements Bi, Pb, Sr, Ca, and Cu in mole ratio of 1.84:0.35:1.91:2.05: 3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=150 mm and diameter=7 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=150 mm.

Contact resistivity of this rod at 77 K in zero-magnetic field was measured and the value achieved was 0.018µOhm-cm$^2$. At that time, the critical current ($I_c$) measured was 192. If converted this critical current to a critical current density (Jc), the obtained $J_c$ was 505 A/cm$^2$ and a fracture strength of 125 MPa. The obtained results are shown in Table 1.

EXAMPLE-22

Precursor powder with silver was prepared by weighing each raw material nitrate powder of the constituent elements Bi, Pb, Sr, Ca, and Cu in mole ratio of 1.84:0.35:1.91:2.05: 3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=150 mm and diameter=7 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=150 mm.

Contact resistivity of this rod at 4.2 K in zero-magnetic field was measured and the value achieved was 0.0016 µOhm-cm². At that time, theoretical current density (Jc) was 6315 A/cm². The obtained results are shown in Table 1.

EXAMPLE-23

Precursor powder with silver was prepared by weighing each raw material nitrate powder of the constituent elements Bi, Pb, Sr, Ca, and Cu in mole ratio of 1.84:0.35:1.91:2.05:3.05 and the additive Ag in mole ratio of 1.2. These were dissolved in double distilled water. This nitrate solution was spray dried to get a homogeneous starting powder with uniform Ag addition in 1.2 Mole ratio. This powder was then calcined immediately in air for 1 hour in an electric furnace already set at 800° C. Thus, the precursor powder with Ag in 1.2 Mole ratio was obtained for sintering.

This precursor powder with Ag in 1.2 Mole ratio was cold isostatically pressed (CIP) at a pressure of 300 MPa into a tube shape, which was 430 mm long with outer diameter of 50 mm and inner diameter of 47 mm. Then this tube was sintered initially at 830° C. in air for 80 hours followed by crushing and mixing to obtain initially sintered powder material. Then a rod of length=200mm and diameter=9 mm was obtained by cold isopressing of this initially sintered powder at a pressure of 400 MPa. At both ends of this tube, 10 mm long grooves were made. Subsequently, first layer of silver was deposited by a metal spray gun. Next, a perforated silver foil was wrapped around the first metal spray deposited silver layer. After the silver foil was wrapped completely leaving a small-unwrapped portion for making external contacts, another silver layer was metal spray deposited.

This entire assembly, that is, this rod with both ends silver contact was finally sintered in air for 100 hours to obtain a Ag added (1.2 Mole ratio) (Bi,Pb)-2223 rod current lead of length=200 mm.

Contact resistivity of this rod at 77 K in zero-magnetic field was measured and the value achieved was 0.021 µOhm-cm². At that time, the critical current ($I_c$) measured was 230 A.

If converted this critical current to a critical current density (Jc), the obtained $J_c$ was 366 A/cm² and a fracture strength of 130 MPa. The obtained results are shown in Table 1.

In Table-1 below is given the collated data from the above noted examples. The comparative data shows the critical current density, contact resistivity at 77 K in self-field and fracture strength (σ) of various (Bi,Pb)-2223 tube/rod current leads and also clearly highlights the resultant novelty of reduction in contact resistivity and improvements both in $J_c$ and σ, due to the non-obvious inventive step of modification of the superconducting material with homogeneous silver addition in the starting raw material itself.

TABLE 1

| Sample No. | Composition Bi:Pb:Sr:Ca:Cu | Ag (Mole Ratio) | Shape | Size (L × OD × ID) Mm | Measurig Temp. (K) | Critical Current Density (A/cm²) | Contact Resistivity (µOhm-cm²) | Fracture Strength (MPa) |
|---|---|---|---|---|---|---|---|---|
| 1. | 1.84:0.35:1.91:2.05:3.05 | 0 | Tube | 320 × 12.4 × 10.0 | 77 | 375 | 0.204 | 98 |
| 2. | 1.84:0.35:1.91:2.05:3.05 | 0 | Tube | 320 × 12.4 × 10.0 | 4.2 | 2500 | 0.036 | |
| 3. | 1.84:0.35:1.91:2.05:3.05 | 0.6 | Tube | 320 × 12.4 × 10.0 | 77 | 537 | 0.052 | 132 |
| 4. | 1.84:0.35:1.91:2.05:3.05 | 0.6 | Tube | 320 × 12.4 × 10.0 | 4.2 | 5320 | 0.005 | |
| 5. | 1.84:0.35:1.91:2.05:3.05 | 1.2 | Tube | 320 × 12.4 × 10.0 | 77 | 712 | 0.037 | 145 |
| 6. | 1.84:0.35:1.91:2.05:3.05 | 1.2 | Tube | 320 × 12.4 × 10.0 | 4.2 | 7530 | 0.0031 | |
| 7. | 1.84:0.35:1.91:2.05:3.05 | 1.8 | Tube | 320 × 12.4 × 10.0 | 77 | 615 | 0.039 | 138 |
| 8. | 1.84:0.35:1.91:2.05:3.05 | 1.8 | Tube | 320 × 12.4 × 10.0 | 4.2 | 6300 | 0.004 | |
| 9. | 1.74:0.34:1.83:1.97:3.13 | 1.2 | Tube | 220 × 30.8 × 28.8 | 77 | 633 | 0.027 | 153 |
| 10. | 1.74:0.34:1.83:1.97:3.13 | 1.2 | Tube | 220 × 30.8 × 28.8 | 4.2 | 6170 | 0.0022 | |
| 11. | 1.84:0.35:1.91:2.05:3.05 | 1.2 | Tube | 220 × 30.8 × 28.8 | 77 | 691 | 0.023 | 160 |
| 12. | 1.84:0.35:1.91:2.05:3.05 | 1.2 | Tube | 220 × 30.8 × 28.8 | 4.2 | 7234 | 0.0010 | |
| 13. | 1.84:0.4:2.0:2.2:3.0 | 1.2 | Tube | 220 × 30.8 × 28.8 | 77 | 590 | 0.025 | 155 |
| 14. | 1.84:0.4:2.0:2.2:3.0 | 1.2 | Tube | 220 × 30.8 × 28.8 | 4.2 | 5946 | 0.0012 | |
| 15. | 1.84:0.35:1.91:2.05:3.05 | 1.2 | Tube | 120 × 12.4 × 10.0 | 77 | 712 | 0.035 | 147 |
| 16. | 1.84:0.35:1.91:2.05:3.05 | 1.2 | Tube | 120 × 12.4 × 10.0 | 4.2 | 7530 | 0.0030 | |
| 17. | 1.84:0.35:1.91:2.05:3.05 | 1.2 | Tube | 400 × 35.0 × 33.0 | 77 | 702 | 0.033 | 170 |
| 18. | 1.84:0.35:1.91:2.05:3.05 | 1.2 | Rod | 100 × 2 | 77 | 1166 | 0.010 | 128 |
| 19. | 1.84:0.35:1.91:2.05:3.05 | 1.2 | Rod | 120 × 4 | 77 | 1150 | 0.010 | 122 |
| 20. | 1.84:0.35:1.91:2.05:3.05 | 1.2 | Rod | 120 × 4 | 4.2 | 10750 | 0.0015 | |
| 21. | 1.84:0.35:1.91:2.05:3.05 | 1.2 | Rod | 150 × 7 | 77 | 505 | 0.018 | 125 |
| 22. | 1.84:0.35:1.91:2.05:3.05 | 1.2 | Rod | 150 × 7 | 4.2 | 6351 | 0.0016 | |
| 23. | 1.84:0.35:1.91:2.05:3.05 | 1.2 | Rod | 200 × 9 | 77 | 366 | 0.021 | 130 |

The main advantages of the present invention are:
1. Improved quality of the basic material not only by addition of silver but also of its uniform mixing at atomic level.
2. Leads to reasonably good values of Ic ~500 A (at 77 K in self-field) which are comparable to Ic of the commercial leads and are much more than 200 A required to energize cryogen free cryocooler or any other superconducting magnet system.

3. Leads to a reduction in contact resistivity by an order of magnitude, thereby generating much lower heat dissipation in comparison to commercial current leads.
4. Leads to reasonably good fracture strength of the range of 122-170 MPa, when compared with reported values for Bi-2212 rod samples, this value is much higher than 35 MPa for melt cast sample and is close to 172 MPa for floating zone samples.
5. Reduces the total process time and also total heat treatment duration range from 250-350 hrs to 160-250 hrs.
6. Heat treatments can be done in air only rather than in oxygen partial pressure.
7. Shows reliable and reproducible data more than 60%.

From the invention described herein above, other embodiments of the invention are possible in the light of the disclosure made herein. It is intended that this specification, examples and the accompanying drawings shall be interpreted as illustrative and not in a limiting sense, with the true scope and spirit of the invention being indicated by the following claims.

The invention claimed is:

1. A process for the preparation of high temperature superconducting (HTS) bulk current leads with improved properties, which comprises the steps of:
   (i) preparing separate water-based solutions of nitrates of Bi, Pb, Sr, Ca and Cu in molar ratio in the range of 1.74 to 1.84:0.34 to 0.4:1.83 to 2.0:1.97 to 2.2:3.0 to 3.13 and then mixing the solutions together to form a single solution;
   (ii) adding silver in molar ratio of 0.06 to 1.8 in the form of a water-based silver nitrate solution in the single solution (i) to obtain a resultant nitrate solution;
   (iii) spray drying the resultant nitrate solution obtained in step(ii) to obtain a spray-dried powder;
   (iv) calcining the spray dried powder to obtain a homogeneous calcined powder;
   (v) cold isopressing (CIP) of the calcined spray dried powder into a large size tube of length of up to 500 mm, outer diameter up to 150 mm and wall thickness in the range of 2 to 10 mm;
   (vi) initial sintering of the cold isostatically pressed tube of step (v);
   (vii) grinding the initially sintered high temperature superconductor (HTS) tube into powder and mixing to obtain a homogeneous initially sintered tube powder;
   (viii) cold isopressing (CIP) of the said homogeneous initially sintered tube powder obtained in step (vii) into final tubes and rods;
   (ix) making of grooves at both ends of the said tubes and rods of step(viii);
   (x) making of a three layer silver metal contact on both end grooves of step (ix); and, xi) co-sintering of the assembly of tubes/rods of step (ix) and the combination of three layer silver metal contacts of step (x), whereby the high temperature superconducting bulk current/leads have a critical current density (Jc) in the range of 366 to 1166 A/cm$^2$ at 77 K in self-field, contact resistivity in the range of 0.010 to 0.039 µOhm-cm$^2$ at 77 K in self field and fracture strength in the range of 122 to 170 MPa.

2. The process according to claim 1, wherein the calcinations of the starting spray dried powder containing Ag is effected at a temperature of the order of 800° C.±10° C. in air for a period of the order of one hour to obtain a precursor powder for sintering.

3. The process according to claim 1, wherein the cold isopressing of the calcined powder into a large size tube is effected at a pressure in the range of 100-300 MPa.

4. The process according to claim 1, wherein the size of the tube obtained from cold isostatically pressed tube is carried out at a temperature in the range of 830° C. to 850° C. in air for a period in the range of 60 to 100 hours.

5. The process according to claim 1, wherein the cold isopressing (CIP)of the initially sintered tube powder into final tubes and rods, respectively, is done at a pressure in the range of 200 to 400 MPa.

6. The process according to claim 1, wherein the forming of metallic contacts at both end parts of said tube or rod consists of making grooves at both ends of the superconductor, depositing a first silver layer by metal spray gun, wrapping a perforated silver foil on the said silver layer, depositing a second silver layer by a metal spray gun on the said perforated silver foil; co-sintering the said combination of first silver layer, wrapped silver foil and second silver layer at a temperature in a range of 830° C. to 850° C. in air for a period in the range of 100 to 150 hours, to obtain a current lead.

* * * * *